US008087379B2

(12) United States Patent
Chandler et al.

(10) Patent No.: US 8,087,379 B2
(45) Date of Patent: Jan. 3, 2012

(54) LOCALIZED PLASMA PROCESSING

(75) Inventors: Clive D. Chandler, Portland, OR (US); Noel Smith, Lake Oswego, OR (US)

(73) Assignee: FEI Company, Hillsboro, OR (US)

( * ) Notice: Subject to any disclaimer, the term of this patent is extended or adjusted under 35 U.S.C. 154(b) by 972 days.

(21) Appl. No.: 11/211,176

(22) Filed: Aug. 24, 2005

(65) Prior Publication Data

US 2006/0045987 A1     Mar. 2, 2006

Related U.S. Application Data

(60) Provisional application No. 60/604,951, filed on Aug. 27, 2004.

(51) Int. Cl.
| | |
|---|---|
| *C23C 16/452* | (2006.01) |
| *C23C 16/507* | (2006.01) |
| *C23C 16/509* | (2006.01) |
| *C23C 16/517* | (2006.01) |
| *C23C 16/455* | (2006.01) |
| *C23F 1/00* | (2006.01) |
| *H01L 21/306* | (2006.01) |
| *C23C 16/06* | (2006.01) |
| *C23C 16/22* | (2006.01) |

(52) U.S. Cl. ............. 118/723 FI; 118/723 E; 118/723 I; 118/723 IR; 156/345.33; 156/345.48; 156/345.39; 156/345.4

(58) Field of Classification Search ............... 118/723 FI, 118/723 E, 723 IR; 156/345.33, 345.48, 156/345.39, 345.4
See application file for complete search history.

(56) References Cited

U.S. PATENT DOCUMENTS

| | | | |
|---|---|---|---|
| 4,626,648 A | 12/1986 | Browning | |
| 4,659,449 A | 4/1987 | Watanabe | |
| 4,870,284 A | 9/1989 | Hashimoto et al. | |
| 5,036,252 A * | 7/1991 | Lob | 315/111.31 |
| 5,108,535 A * | 4/1992 | Ono et al. | 156/345.35 |
| 5,188,705 A | 2/1993 | Swanson et al. | |
| 5,350,480 A * | 9/1994 | Gray | 156/345.26 |
| 5,504,340 A | 4/1996 | Mizumura et al. | |
| 5,827,786 A | 10/1998 | Puretz | |

(Continued)

FOREIGN PATENT DOCUMENTS

JP           62-13272           1/1987

(Continued)

OTHER PUBLICATIONS

Y.Yin, J. Messier, and J. Hopwood; "Miniaturization of Inductively Coupled Plasma Sources," IEEE Trans. Plasma Science, vol. 27, No. 5, pp. 109-116, 1992.

(Continued)

*Primary Examiner* — Rudy Zervigon
(74) *Attorney, Agent, or Firm* — Scheinberg & Griner, LLP; Michael O. Scheinberg

(57) ABSTRACT

A method of localized plasma processing improves processing speed and reduces work piece damage compared to charged particle beam deposition and etching. In one embodiment, a plasma jet exits a plasma generating chamber and activates a reactive gas. A jet of plasma and reactive gas impacts and processes the work piece. Because the plasma and the ions in the reactive gas can have low kinetic energy, there can be little or no surface damage. This is particularly useful for deposition processes. When it is desired to etch material, the reactive ions can be more energetic to enhance etching.

28 Claims, 2 Drawing Sheets

U.S. PATENT DOCUMENTS

2005/0183667 A1    8/2005    Keller et al.

FOREIGN PATENT DOCUMENTS

| | | |
|---|---|---|
| JP | 06176725 | 6/1994 |
| JP | 06-283298 | 10/1994 |
| JP | 07-206414 | 8/1995 |
| JP | 07312201 | 11/1995 |
| JP | 07335163 | 12/1995 |
| JP | 10249161 | 9/1998 |
| JP | 2003-068719 | 3/2003 |
| JP | 2003-213404 | 7/2003 |
| JP | 2003-311146 | 11/2003 |

OTHER PUBLICATIONS

J. Hopwood; "A Microfabricated Inductively-Coupled Plasma Generator," Journal of Microelectronmechanical Systems 9(3), 309-313, (2000).

Coupland, J.R. et al., "A Study of the Ion Beam Intensity and Divergence Obtained from a Single Aperture Three Electrode Extraction System," Rev. Sci. Instrum., Sep. 1973, pp. 1258-1270, vol. 44, No. 9.

Japanese Office Action from related Japanese application 2005-246402, Aug. 30, 2011.

Office Action from related U.S. Appl. No. 12/877,002, Jun. 23, 2011.

* cited by examiner

LOCALIZED PLASMA PROCESSING

The application claims priority from U.S. Prov. Pat. App. No. 60/604,951, filed Aug. 27, 2004, which is hereby incorporated by reference.

TECHNICAL FIELD OF THE INVENTION

The present invention relates to plasma processing of a relatively localized area of a work piece.

BACKGROUND OF THE INVENTION

Many different processes are used in the production of modern miniature devices, such integrated circuits and Micro Electro Mechanical Systems (MEMS). Many such-devices are fabricated on a semiconductor wafer substrate. During manufacturing, it is typically most efficient to use techniques that process the entire wafer simultaneously. For example, a layer of metal may be deposited on the entire wafer, a pattern of a photoresist is formed over the metal using photolithography, and then the entire wafer is exposed to an etchant, such as a plasma, that removes the metal where it is not protected by the photoresist.

A plasma is a collection of free charged particles moving in random directions, with the collection being, on average, electrically neutral. Gases fed into plasma generating systems are continuously broken into positive ions and chemically reactive compounds that flow to and react with a work piece surface. The chemically reactive compounds can etch the surface or decompose to deposit material onto the surface. Plasmas can also physically sputter the surface or implant materials into the surface.

Plasmas are used extensively in semiconductor manufacturing to, among other things, remove layers from wafers, to implant materials into wafers, and to deposit materials from wafers. As the size of the substrate on which semiconductors are fabricated increases to 300 mm and larger, the industry has struggled to produce plasma discharges that are uniform over the surface of a wafer so that all areas receive the same amount of processing.

Some processes used in the fabrication of miniature devices are not applied to the whole wafer, but are applied to only a local area. Such methods involve scanning a finely focused ion beam in a pattern over a target surface to mill, etch, or deposit material. Milling involves the direct removal of surface material by the impact of ions in a process called sputtering. In focused ion beam (FIB) deposition, a gas, typically including organometallic compounds, is directed toward the impact point of the FIB on the target surface. The gas decomposes in the presence of the ion beam to add material to the target surface. Ion beam assisted deposition processes are described, for example, in U.S. Pat. No. 5,827,786 to Puretz for "Charged Particle Deposition of Electrically Insulating Films." FIB-enhanced etching uses a reactive gas in combination with the FIB to increase the number of surface atoms removed by each impinging ion. Such a process is described, for example, in U.S. Pat. No. 5,188,705 to Swanson et al. for "Method of Semiconductor Device Manufacture."

In FIB deposition and etching, the reactive gas is adsorbed onto the work piece surface and reacts in the presence of the ion beam. The deposition and etch rate is relatively low compared to non-localized processes that simultaneously process the entire wafer. The rate of material removal or deposition depends on the number of charged particles in the beam striking the target surface, the rate at which gas molecules are adsorbed by the surface, and the number of atoms removed or deposited by each charged particle.

While the density of charged particles in a focused ion beam can be relatively high, the beam diameter is typically very small, so the total number of particles striking the surface is relatively small, which means a relatively slow processing rate. Moreover, the high current density in the beam means that gas molecules adhered to the surface area quickly exhausted, and the beam must stop processing the surface until additional gas particles have time to adsorb to the surface.

Because such charged particle beam processes are much slower than whole wafer processing, such processes are typically used for extremely fine work, such as altering prototype circuits, quality control and repair of integrated circuits, preparing sample for a transmission electron microscope, forming probe tips for nanoprofilometers, forming read/write heads for disk drives, and for lithography mask repair.

There are other disadvantages to the use of a focused ion beams for etching and depositing material. Because of the mass and energy of ions in the beam, the beam will inadvertently cause damage to the surface of the substrate and leave implanted ions within the crystal structure of the substrate. This can change the electrical and optical properties of the substrate. This can also change the shape of the features on the substrate, so that subsequent measurements do not accurately characterize the features before processing.

A method of localized processed that has a high deposition or etch rate and that minimizes damage to the substrate is needed.

SUMMARY OF THE INVENTION

An object of the invention is to provide a method of localized processing that has a relatively high processing rate and produces minimal unintentional damage to the substrate.

The invention provides a method and apparatus for localized plasma processing. In some embodiments, the reactive ions contacting the work piece can have very little kinetic energy to minimize or eliminate damage to the substrate surface. The quantity of reactive gas molecules striking the work piece surface in a plasma system of the invention can be much greater than the quantity of reactive gas molecules generated by a charged particle beam, so the deposition and etch rate are much greater than the rates typically achieved by focused charged particle beam systems.

Because, unlike prior art plasma processing systems, the plasma processing is localized, some embodiments of the invention are suitable for use within a vacuum chamber, without raising the pressure in the vacuum system to unacceptable levels. For example, the localized plasma processing could be performed in a vacuum chamber that includes a focused ion beam system, a scanning electron microscope, or a transmission electron microscope. A work piece can be processed by the invention and then operated upon by a charged particle beam, without the inefficiency of having to open the vacuum chamber and subsequently re-evacuate the chamber.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

A preferred embodiment can be used for localized plasma processing for many applications. In some embodiments, the invention can be used for applications that are currently performed using a charged particle system with a gas injection system (GIS). In these embodiments, the invention uses a plasma to activate a reactive gas, rather than using a charged particle beam. A wider variety of gases can be used in the invention than in a conventional GIS system, because in a typical charged particle beam system, the gas must adhere to the surface to be activated by the charged particle beam. The present invention can use almost any gas that is currently used in GIS systems, as well as gases that are currently used in plasma systems for whole wafer processing. Because the jet of reactive gas of the present invention is typically not as focused as a charged particle beam, embodiments of the invention process a larger area.

Embodiments of the present invention can process areas that are smaller than areas processed in prior art plasma processing systems. The work piece is positioned outside the plasma chamber and a jet of plasma and/or reactive gas is directed toward the work piece. Various embodiments can process an area that is smaller than 5 mm, smaller than 1 mm, smaller than 0.5 mm, or smaller than 0.2 mm. The processed area can have a diameter that is much smaller than the work piece, e.g., less than about ½, ⅒, 1/50, 1/100, 1/500 of the work piece surface area, so the invention can be used to process a relatively small portion of the work piece. The invention is not limited to any particular size, neither large nor small.

Embodiments can process the work piece at rates that are much higher than the rate achieved by conventional charged particle beam processing with gas injection systems.

Figure 1:
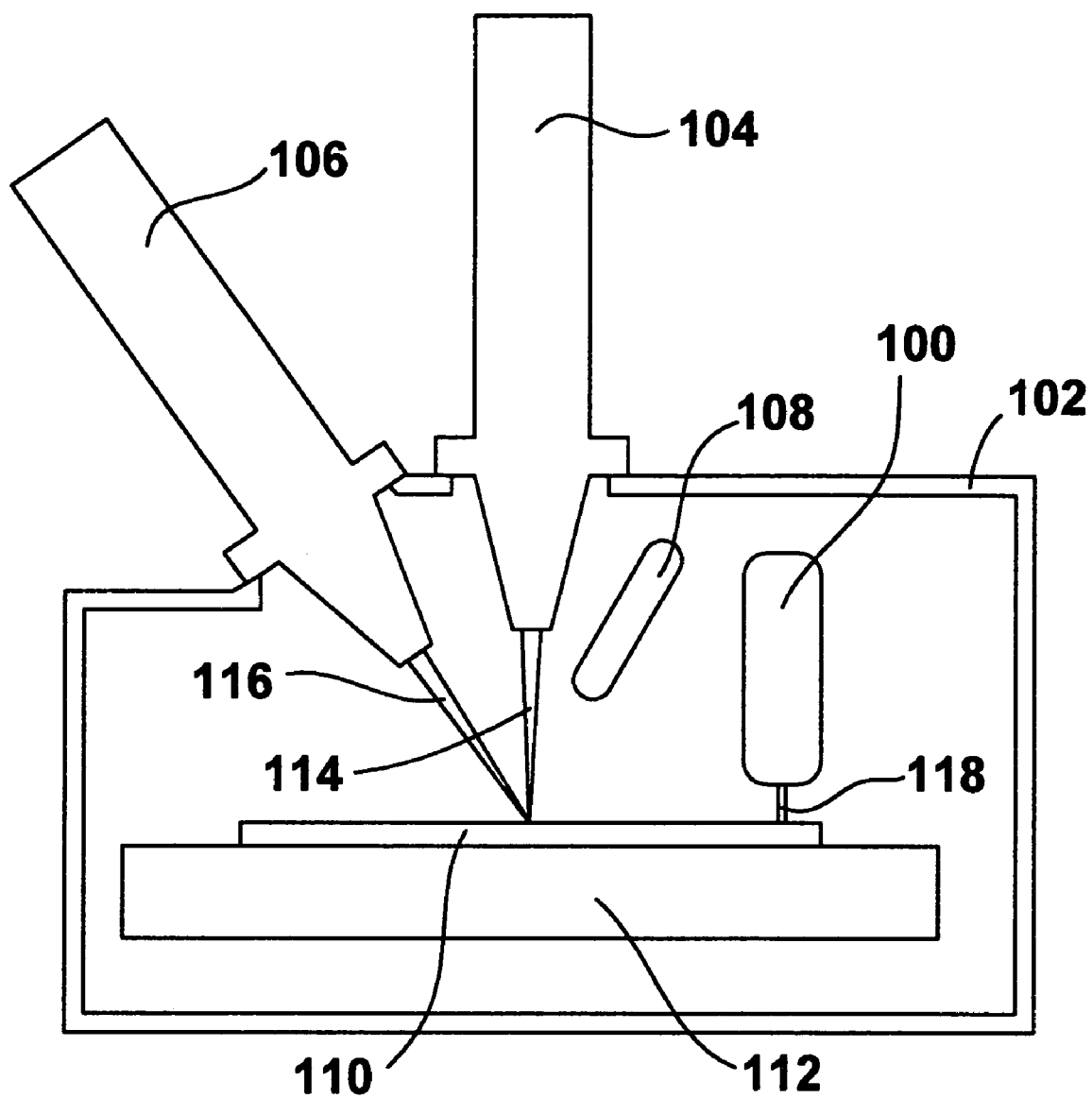
FIG. 1 shows a charged particle beam system incorporating a localized plasma processing system embodying the invention.

FIG. 1 shows schematically a preferred embodiment of the present invention including a plasma processing system 100 producing a beam 118 of plasma and/or reactive gasses inside a vacuum chamber 102 that also includes a focused ion beam system 104 producing a beam of ions 114, a scanning electron microscope 106 producing a beam of electrons 116, and a detector 108 for detecting secondary or backscattered particles generated from the impact of the ion beam or the electron beam onto the surface of a work piece 110. A movable stage 112 holds the work piece and moves the work piece between processing positions for either of the charged particle beam or the plasma system. In some embodiments, the plasma system 100 is aimed to impact the work piece 110 at an area overlapping the impact point of one or both of the charged particles beams 114, 116, so that the work piece 110 does not have to be moved between processing position. There are many other elements and accessories known and used in charged particle beam systems. Dual charged particle beam systems are described, for example, in U.S. patent application Ser. No. 10/889,967 for a "Dual Beam System," which is hereby incorporated by reference and is assigned to FEI Company, the Assignee of the present invention. The invention is not limited to use in a vacuum chamber or with any other instruments, that is, the invention can be used for stand-alone processing of a work piece. The invention could be used in a chamber housing a scanning probe microscope or a stylus nanoprobe.

In a preferred embodiment of the invention, the plasma source is an inductively coupled plasma source operating in a balanced antenna mode, as described in U.S. Prov. Pat. App. No. 60/546,142, which is assigned to the assignee of the present application, and which is hereby incorporated by reference. Such a plasma source reduces or eliminates the capacitive coupling between the antenna and the plasma by driving the antenna from opposite ends with signals that are out of phase by as much as 180°. Such a system creates a region in the plasma where the electrical potential fluctuations from the radio frequency source are substantially zero at all times. The region of zero potential is positioned near the opening of the plasma source so that ions leaving the plasma chamber have minimal potential energy modulation from the rf coils to do minimal or no damage to the work piece. Thus, the energy of the exiting ions is the thermal energy, which is very low, and the acceleration from the plasma sheath, which can be as low as 1.5 V, although more typically around 30 V. This mode provides for good control of axial ion energies and also for reasonably well collimated, i.e., laminar, ion flux. The preferred plasma source maintains the ions at an energy level that is below the threshold for sputtering the walls of the plasma chamber, thereby increasing the life of the plasma source, as well as reducing the work piece damage.

In most other plasma generation methods, the radio frequency radiation creates oscillations of several hundred volts in the electrical potential energy of the plasma. Such oscillations significantly increase the energy of some of the ions that impact the work piece, thereby damaging the work piece surface. In some applications of the inventions, particularly in etching applications, such higher energy ions are not a problem, and plasma generation methods that produce oscillations or higher energy ions are acceptable. Embodiments of the invention can also use other types of plasma discharges, such as capacitive discharges, other types of inductive discharges, wave-heated discharges, and DC discharges.

Figure 2:
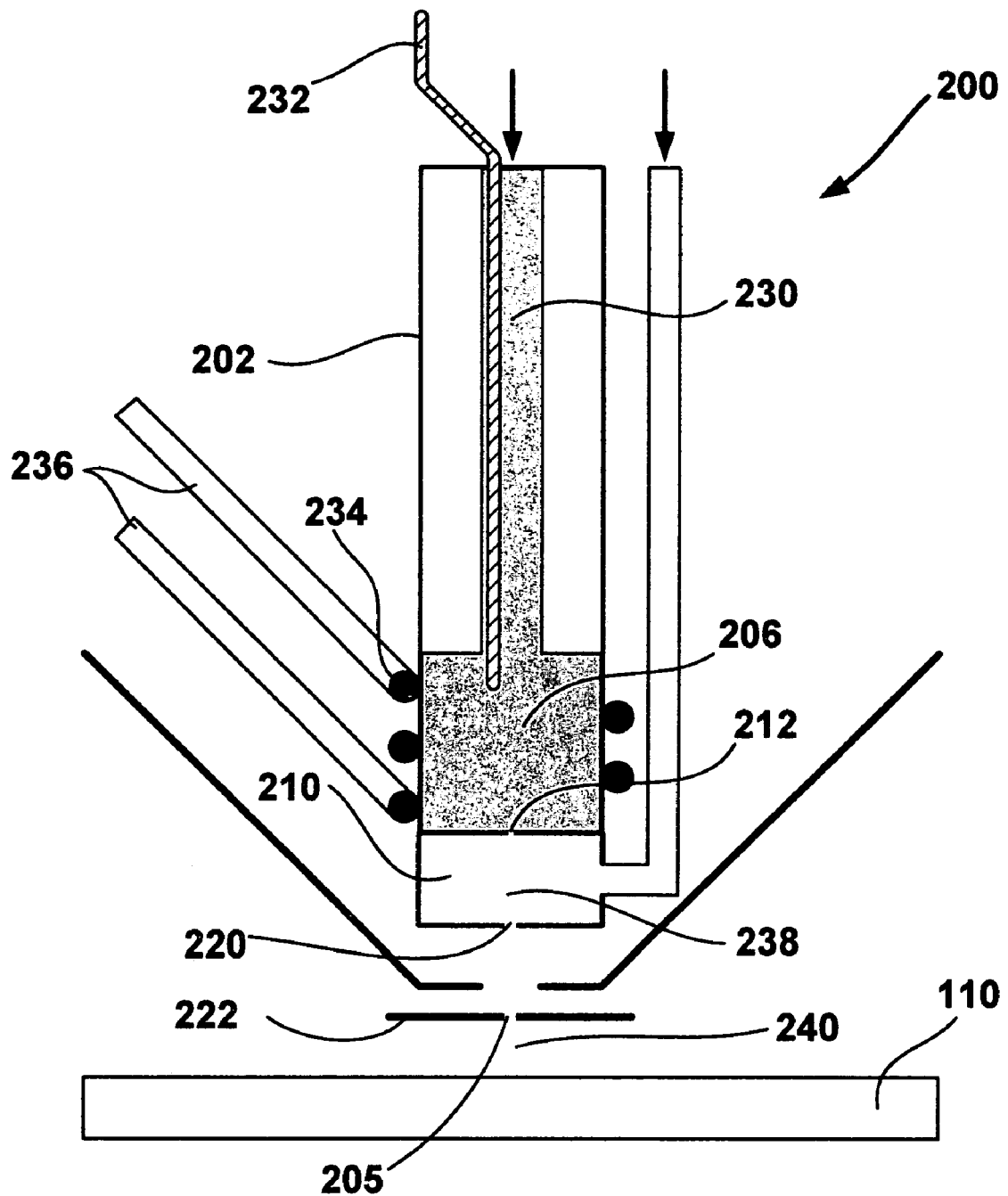
FIG. 2 shows a plasma source for use with the invention.

FIG. 2 shows a preferred plasma source 200. Plasma source 200 includes a dielectric tube 202 that forms a portion of the outer walls for a plasma chamber 206 and a reactive gas chamber 210. The dielectric tube 202 is constructed of an insulating material, such as $Al_2O_3$. The material should also be chosen to withstand the corrosive effects of the plasma and of gases, such as fluorine compounds, that will be used in the reactive gas chamber 210. Dielectric tube preferably has an internal diameter of about 0.5 cm. Plasma gas feed tube 230 supplies a gas, such as argon, into the plasma chamber 206 to maintain the plasma. A reactive gas feed 242 supplies a reactive gas for etching or deposition into reactive gas chamber 210. A wire 232 is used to control the electrical potential of the plasma, which controls the energy with which particles strike the work piece 110. Coil 234 applies radio frequency (rf) energy to the plasma in plasma chamber 206. The coil typically includes 1-6 turns of copper wire, each coil spaced ~about 1 mm apart. The number of turns of the coil is not critical, but skilled persons will recognize that the impedance of the tuning circuit is adjusted depending on the coil configuration. Wires 236 supply the rf power to coils 234. An rf shield 252 prevents or reduces the propagation of rf energy into the local environment, such as into a vacuum chamber where it could interfere with a focused ion beam, electron beam, a stylus instrument, such as a scanning probe microscope or other equipment.

Plasma chamber 206 is preferably about 1.0 cm long. Plasma chamber 202 has an opening 212 at one end from which a jet of particles 238 from the plasma can exit plasma chamber 206 and enter reactive gas chamber 210, which typically contains a reactive gas, such as $CF_4$, or a mixture of reactive and non-reactive gases. The opening 212 is preferable approximately circular and has a diameter of about 0.1 mm. Different sizes and shapes of opening 212 could be used to alter the shape of the gas jet and therefore the shape of the processed area. The plasma jet activates the reactive gas, and a jet 240 comprising a mixture of plasma, reactive gas, and neutral gas exits aperture 220 and processes the work piece. The neutral gas is a mixture of neutral argon and unreacted process gas. Not all of the argon will be made into plasma; similarly not all of the reactive gas will be processed by the plasma.

Reactive gas chamber 210 is preferably between 0.1 and 0.5 mm long and typically about 0.2 mm long. It should be long enough to provide sufficient interaction between the plasma and the reactive gas to activate a sufficient amount of the reactive gas, but not so long that it absorbs the plasma jet before the jet exits the chamber. The preferred length of the reactive gas chamber may vary with the volume and energy of the plasma jet, and the type and pressure of the reactive gas. Pressure within the reactive gas chamber 210 may vary depending upon the gas used and depending upon the process. For an etching process, using $CF_4$ as a gas, a typical pressure in the plasma chamber would be about $10^{-5}$ mTorr. The reactive gas may be, for example, a pure gas or a mixture of gases including some non-reactive components.

Wrapped around the plasma chamber 206 is a conductive coil 234, which carries an alternating current that transfers energy to the plasma by induction. The pressure of gas inside the plasma chamber is preferably in the range of 1-10 mTorr. The coil can be driven at 13.56 MHz. Higher frequencies, such as 27 MHz, or as high as 450 MHz may be preferable for some applications. The frequency is chosen based on the electron-neutral collision frequency as a starting place. The closer the frequency corresponds to the electron-neutral collision frequency the more efficient the plasma generation. Skilled persons can choose an appropriate frequency using guidance found in the literature, for example, Jeffery A. Hopwood, *Ionized Physical Vapor Deposition*, Academic Press, (1999) or Michael A. Lieberman and Allan J. Lichtenberg in *Principles of Plasma Discharges and Materials Processing*, John Wiley and Sons, (1994), which are hereby incorporated by reference to the extent that it is not inconsistent with the description herein A beam-defining aperture 222 has an opening 205 that controls the spot size of the reactive gas jet 240 on the work piece 110. The preferred spot size will depend on the application, and may typically be about 0.2 mm. Other preferred spot sizes include smaller than about 5 mm, smaller than about 1 mm, smaller than about 0.5 mm, smaller than about 0.1 mm, smaller than about 0.08 mm, smaller than about 0.05 mm or even smaller. The opening 205 is typically positioned about 5 mm from the work piece 110 and produces a spot size of about 0.2 mm on the work piece. The size of the plasma chamber 206 and of the corresponding spot size on the work piece will vary with application. The invention is very flexible and systems can be readily constructed to produce an appropriate spot size and current for different applications.

The configuration described above is merely an example, and many different configurations of the invention are possible. For example, in the configuration described above, the reactive gas is maintained outside of the plasma chamber 206 and is activated by a jet of plasma. In some embodiments, the reactive gas is fed directly into the plasma chamber, and a jet of the reactive gas from the plasma chamber, activated by the plasma, exits the plasma chamber and is directed directly toward the work piece surface. These embodiments are more limited to reactive gases that will significantly not etch or deposit, particularly conductive layers, in the plasma chamber. For deposition of the conductive materials needed in metrology work there is preferably no deposition of the conductive materials on the inside of the plasma chamber. Conductive layers on the inside of the plasma chamber will short out the induction process and no plasma will be produced. In other possible configurations, the plasma chamber and reactive gas can have separate housings, instead of using a single tube 202. Some embodiments can function without using a reactive gas at all, by using the plasma to sputter etch the work piece.

The etching rate can vary from 0 to 100's of μm/min. It depends on the pressure of the etching gas, the power applied to the plasma and the electrical potential difference between the plasma and the sample. A potential difference can be applied by biasing the plasma, the work piece, or both. A potential difference is applied, for example, if it is desired to etch material by sputtering instead of, or in addition to, chemical etching. Sputtering is the removal of material by physical knocking material off the surface using energetic ions, as opposed to chemically reacting with the surface material. Etch rates can vary with the material and in some embodiments, typical etch rates can be higher than 20 μm/min, 50 μm/min, 100 μm/min or 120 μm/min. The present invention can provide deposition rates greater than 100 μm$^3$/sec, greater than 500 μm$^3$/sec, or greater than 1000 μm$^3$/sec.

The minimum and maximum pressures used in the plasma chamber vary with the type of plasma source. The minimum pressure is that required to sustain the plasma. This will vary depending on the power applied to the plasma source since the power required increases as the gas pressure is decreased. When the plasma chamber exit is in a vacuum chamber containing a charged particle beam system, the pressure in the plasma chamber is preferably sufficiently low that the background pressure in the vacuum chamber remains within the operating pressure of the charged particle beam system. In some embodiments, the plasma chamber pressure is in the millibar range, and the vacuum chamber pressure rises to 2 or $3 \times 10^{-5}$ mbar during processing. The invention can be used with an environmental scanning microscope (ESEM)-type system, which can operate at a higher chamber pressure than a conventional SEM. When used with an ESEM, the reactive gas chamber can be maintained at a higher pressure, often because a much higher background pressure in the system vacuum chamber is acceptable.

The plasma chamber can be made as small as possible to localize the processing area on the substrate. The physical limitation on the size of the chamber is determined by the thickness of the plasma sheath, an electrically charged region formed between the neutral plasma and the chamber wall. The plasma sheath is typically several hundred microns thick.

Table 1 describes a list of gases that are useful for etching different materials. Many of the etch gases preferentially etch certain materials, so it is often possible to select an etchant that will remove the desired material while not substantially etching a substrate under the material to be removed. Table 2 lists precursor gases that are useful for depositing various materials. In some applications, etchant gases are used in a pure form in the reactive gas chamber plasma source, and in other applications, the etchant gases are mixed with a noble gas to reduce the reaction rate.

TABLE 1

| MATERIAL TO BE ETCHED. | GAS MIXTURE (% OF TOTAL) | OTHER GASES OR GAS MIXTURES |
|---|---|---|
| Aluminum | $Cl_2$, $BCl_3$, $CHCl_3$, He $BCl_3$, $CH_4$, $Cl_2$ | $CCl_4$; $CCl_4 + Cl_2$; $SiCl_4$ |

TABLE 1-continued

| MATERIAL TO BE ETCHED. | GAS MIXTURE (% OF TOTAL) | OTHER GASES OR GAS MIXTURES |
|---|---|---|
| $Al_{0.5}Ga_{0.5}P$ | IBr, Ar | |
| | $CH_4, H_2, Ar$ | |
| Au | $CF_4, CCl_4$ | |
| Carbon | $O_2, CF_4$ | $O_2$ |
| Cu | Ar, $Cl_2$ | |
| GaAs | $BCl_3$, Ar, $Cl_2$ | |
| GaN | $CH_4, H_2, Ar$ | |
| | $Cl_2$, Ar | |
| | ICl, Ar | |
| Silicon | Cl | $SF_6$; $CF_4$; $CF_4 + O_2$; $NF_3$; $Cl_2$; $CCl_4$; $CCl_3F$; $CCl_2F_2$ |
| | $C_2F_6$, Cl | $CClF_3$; $BCl_3$; $HBr + Cl_2 + O_2$, $SiCl_4 + Cl_2$ |
| | $C_2F_6$, Cl | |
| SiC | $CHF_3, CO_2$ | |
| | $CF_4, H_2$ | |
| | $CHF_3, O_2$ | |
| $SiO_2$ | $C_2F_6, O_2$ | $C_2F_6$; $C_3F_8$; $NF_3 + Ar$; $CF_4 + H_2$; $CHF_3$ |
| | $CF_4$, Ar | $BrF_3$; $ClF_3$; $BrF_5$; $IF_5$; $SF_6$ |
| | $CF_4$, Ar, $CHF_3$ | |
| | $CH_4$, Ar, $C_3F_8$ | |
| Ta | $Cl_2, CCl_4$ | |
| | $O_2, CHF_3, CF_4$ | |
| Ti | $O_2$, He, $CF_3Br$ | |
| TiN | | $CF_4 + O_2$ |

TABLE 2

| MATERIAL DEPOSITED | PRECURSOR GAS |
|---|---|
| Silicon | $SiH_4$ |
| SiCOH | TEOS |
| | TMCTS |
| $SiO_2$ | $TEOS/O_2$ |
| | $TMCTS/O_2$ |
| | $SiH_4/O_2$ |
| SiN | $SiH_4 + NH_3$ | work piece. Some embodiments of the invention can provide very low energy ions. Ions in the plasma are typically at a potential of about +30 V, so ions reaching a grounded work piece have an energy of about 30 eV, when the plasma is not further biased with respect to the work piece. Such low energy ions are useful for plasma enhanced deposition processing because the low energy ions cause little or no changes to the work piece upon impact. Low ion energies are particularly useful in metrology operations, because the surface being measured is altered little or not at all. When it is desired to use higher energy ions, such as for etching, the ion energy can be increased by biasing the plasma with respect to the work piece. The control over axial energies allows for deposition without damaging the substrate, and for providing higher energy ions for etching. Low ion energies within the plasma chamber reduces sputtering of the plasma chamber, which increases the life of the plasma source.

The present invention allows for depositing conductive or insulating layers in less than five seconds, compared to about 40 seconds required using charged a focused ion beam. The present invention also extends the life of the GIS system in a charged particle beam system. Depending on the gas in the gas injection system (GIS) the life of a typical GIS varies from 60 to 200 hrs of GIS use. Reducing the amount of time that gas is used increases the lifetime of the GIS and reduces service down time and costs, as well as reducing the need to align the GIS to the FIB or electron column. The invention can also reduce the amount of time required to process a site on a wafer and thereby increase the number of sites visited per wafer or increase the number of wafers per hour placed in the tool.

Table 3 below provides some preferred values and ranges for parameters for various aspects of some embodiments.

TABLE 3

Preferred Ranges and Values for System Parameters

| | Preferred Pressure (mbar) | | | Diameter [mm] | | Length [mm] | | Exit Aperture [mm] | |
|---|---|---|---|---|---|---|---|---|---|
| | Typical Value | Range | Gas Type | Typical Value | Range | Typical Value | Range | Typical Value | Range |
| Plasma Chamber | | 1-10 | Argon, other noble gases | 5 | 1-10 | 10 | 1-10 | 0.1 | 0.05-0.5 |
| Reactive gas Chamber | $10^{-3}$ | $10^{-4}$-1 | Any GIS or plasma processing gas. See Tables 1 and 2 | 5 | 1-10 | 2 | 1-10 | 0.1 | 0.05-0.5 |
| Work piece vacuum chamber | $1 \times 10^{-5}$ | $5 \times 10^{-6}$- $3 \times 10^{-5}$ | NA | NA | | NA | | NA | |

A suitable concentration for an application can be determined by experimentally finding a concentration that is sufficiently high to deposit uniformly but not so high that particles are formed or the deposition becomes uneven. Almost any gases that are known to be useful with charged particle beam systems or with plasma systems can be used with the present invention.

In some applications, it is desirable that the ions reaching the work piece have a very low energy to avoid damage to the The invention can be used for many different applications. It can be used to deposit conductors and insulator, or to etch or decorate different layers of material in the work piece to facilitate defect analysis or metrology. The plasma source can operate using the same gases that are used in FIB GIS and at the same background pressure in the vacuum chamber. Because the amount of reactive gas delivered by the source is typically much greater than that required for deposition, the invention can use a noble gas plasma into which the reactive species is injected. This provides better control over deposition thickness and avoid gas phase nucleation reactions. The deposition occurs at much lower ion energies compared to a focused ion beam, thereby minimizing sample damage.

When higher plasma energies are desired, such as to enhance etching, the plasma can be electrically biased with respect to the work piece to provide the ions higher kinetic energy upon impact. Using an AC potential can minimize work piece charging effects by providing electrons as well as ions to the work piece. The invention can supply charge to the work piece for charge neutralization.

Removal of Surface Contamination

The present invention provides for a method of rapidly removing surface contamination from a work piece, and is useful, for example, in electron beam microscopy. Because the invention can be used within a vacuum chamber, the work piece can be cleaned using the invention and then viewed without removing the work piece from the vacuum chamber, which would cause additional contamination.

Scanning electron microscopes are know to cause carbon deposition onto a work piece by the interaction of the electrons with carbon bearing material that is typically present in low concentrations from lubricants or seals within a vacuum system. The invention can remove the carbon deposits and thereby improve SEM images. For example, the plasma chamber can supply a jet of plasma, the plasma activating a reactive gas, and the reactive can impinge on the work piece surface to remove the carbon. The user can then view a cleaner, clearer, and more accurate image of the carbon-free surface. The reactive gas chosen preferably reacts with carbon, but less strongly or not at all with the substrate material below the carbon.

Oxygen or a gas containing oxygen, such as water vapor or a mixture of oxygen and $CF_4$, can be used as the working gas for removing carbon contamination or for etching carbon in general. Table 1 shows gases that can be used to etch different materials.

Delineation Etch

During semiconductor process development and process control, an engineer will sometimes examine the thickness or uniformity of layers by milling a portion of the substrate to expose a cross section of the layers. When adjacent layers are composed of similar materials, it can be difficult to determine where one layer stops and another layer starts. Because the layers or the interface between the layers etch at slightly different rates, an engineer will sometime lightly etch the cross section to make the edges of the layers more apparent. This technique is known as a "delineation etch."

For example, a focused ion beam can be used to mill a hole to expose a cross section of a work piece, and then the present invention can be used to rapidly etch the exposed cross section to delineate the layers, without removing the work piece from a vacuum chamber. For example, a gaseous compound containing fluorine and carbon could be used to delineate layers of oxides of silicon. The cross section is then observed using an instrument, such as a scanning electron microscope. Skilled persons can choose an appropriate compound for the layers to be delineated. See Table 1 for specific etch compounds.

Deposition of Protective or Conductive Layers

To view work pieces in an electron microscope, it is common to deposit a layer of material onto the work piece to protect the surface or to remove excess electrical charge that would build up on an insulating work piece during viewing. For example, layers of carbon, platinum or gold are common.

The present invention can be used within the same vacuum chamber as the observing instrument to rapidly deposit such coatings before viewing.

Such layers are sometime deposited using a charged particle beam, which is relatively slow and can alter the work piece. Photoresist, for example, is very sensitive to exposure to charged particle beams. Photoresist shrinks under exposure to an ion beam; and under an electron beam swells at first and then shrinks. The present invention can apply a coating onto photoresist with minimal damage. For example, a coating of tungsten could be applied using $W(CO)_6$ as a precursor gas. After the coating is applied, the work piece is observed using a charged particle beam system, such as an electron microscope or a focused ion beam system.

Removal of Deposited Layers

The present invention can be used to remove such layers after observation is complete. A gas is preferably chosen that will selectively etch the material to be removed and that will not substantially etch the underlying substrate. The energy level of the ions in the plasma can be maintained at a low level to minimize damage to the work piece. A gas is preferably selected that will etch the deposited conductive layer but not the layer under it.

Rapid Removal of Relatively Large Amounts of Material

In some application, it is desired to remove relatively large amount of material quickly. For example, a sample used in a transmission electron microscope must be thin, preferably less than 200 nm thick. It is often necessary to rapidly thin a thicker sample before observing the sample in a TEM. The invention can be used to rapidly thin a TEM sample. The invention can also be used to rapidly remove contamination from the TEM sample. The gas to be used for thinning a sample will depend on the composition of the sample. Table 1 describes gases suitable for etching a variety of materials.

Other examples in which the invention is suitable for removing large amounts of material rapidly includes removing several layers over a broad area to expose underlying layers for examination or to remove large amounts of material from the backside of a "flip-chip" to access circuit layers. For example, one could use chlorine or a chlorine compound for removing specific materials. To remove material, a user would typically mount the work piece in a work piece holder. The user would then direct a jet of plasma and reactive gas toward the work piece. The specific gas could be selected from any of the gases in Table 1 or other known gases.

While various configurations of a plasma generator are described above, the invention is not limited to any particular type of plasma generator, and the type of generator used will depend upon the specific application. Similarly, while several gases are described above and in the attached tables, the invention is not limited to any particular gases. Any gas that is known from other types of plasma processing for etching or for plasma-enhanced chemical vapor deposition can be used with the invention. Various types of plasmas generators and gases used for plasma processing are described in by Michael A. Lieberman and Allan J. Lichtenberg in *Principles of Plasma Discharges and Materials Processing*.

Although the present invention and its advantages have been described in detail, it should be understood that various changes, substitutions, and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A processing system, comprising:
a vacuum for containing a work piece;
a plasma system for processing the work piece in the vacuum chamber, the plasma system including;
a plasma chamber;
a gas entrance for introducing an unionized gas to be ionized in the plasma chamber; and
an aperture for extracting a jet of plasma from the plasma chamber;
a reactive gas chamber positioned to receive at least a portion of the jet of plasma from the plasma chamber, and having
a second aperture for extracting a jet of an activated reactive gas directly into the vacuum chamber including the work piece, and
a reactive gas entrance, for introducing into the reactive gas chamber an unionized, unactivated reactive gas to be activated by the plasma jet from the plasma chamber;
a focused ion beam system for directing a focused beam of ions toward the work piece in the vacuum chamber;
a secondary particle detector for detecting secondary or backscattered particles generated from the impact of the ion beam onto the surface of the work piece; and
a work piece holder for holding the work piece to be processed by the focused ion beam or to be impacted by the jet of activated reactive gas from the reactive gas chamber for processing the work piece, the processing system capable of processing the work piece by the ion beam or by the reactive jet without removing the work piece from the vacuum chamber.

2. The system of claim 1 in which the second aperture in the reactive gas chamber is sufficiently small such that the pressure in the vacuum chamber is maintained at or below $10^{-4}$ Torr.

3. The system of claim 2 further comprising a scanning electron microscope for directing an electron beam toward the work piece to obtain an image of the work piece in the vacuum chamber.

4. The system of claim 1 in which the plasma system includes an inductively coupled plasma generator.

5. The system of claim 1 in which the plasma system includes a capacitively coupled plasma generator.

6. The system of claim 1 further comprising an electrode positioned in the plasma-generating chamber for biasing a plasma in the plasma chamber to control the energy with which particles from the plasma chamber strike the sample.

7. The system of claim 6 in which the electrode biases the work piece relative to the plasma so that ions impact and process the work piece.

8. The system of claim 1 further comprising a source of a reactive gas, the reactive gas comprising a deposition precursor.

9. The system of claim 1 in which the reactive chamber filled with a reactive gas at a pressure of between 1 mbar and $10^{-4}$ mbar.

10. The system of claim 1 in which the reactive gas chamber is positioned between the plasma chamber and the work piece and in which the length of the reaction gas chamber allows sufficient interaction between the plasma and reactive gas to activate a sufficient amount of reactive gas to process the sample, but the length is not so long that it absorbs the plasma before a jet sufficient to process the work piece exits the chamber.

11. The system of claim 1 in which the plasma chamber includes an ionized noble gas.

12. The processing system of claim 1 further comprising a movable stage for moving the work piece between a plasma system processing position and a focused ion beam processing position.

13. The processing system of claim 1 in which the work piece is processed at the same position by the plasma system and the focused ion beam system.

14. A processing system comprising:
a vacuum chamber containing a stage for holding a work piece;
a reactive gas chamber containing a reactive gas activated by a plasma, the reactive gas chamber having a diameter and an opening for the activated reactive gas to exit the reactive gas chamber directly into the vacuum chamber containing the stage and impact the work piece, the opening of the reactive gas chamber being smaller than the diameter of the reactive gas chamber;
a source for supplying the reactive gas to the reactive gas chamber;
a power supply for supplying energy to maintain the plasma;
an electrode positioned within the plasma for providing a potential difference between the plasma and the work piece to control the energy of ions reaching the work piece;
a charged particle beam system for directing a beam of ions or a beam of electrons toward the work piece in the vacuum chamber; and
a secondary particle detector for detecting secondary or backscattered particles generated from the impact of the charged particle beam onto the surface of the work piece, the system capable of processing the work piece by the ion beam or by the reactive jet without removing the work piece from the vacuum chamber.

15. The processing system of claim 14 further comprising a plasma chamber positioned such that the reactive gas in the reactive gas chamber is activated by a jet of plasma exiting the plasma chamber and passing through the reactive gas chamber.

16. The processing system of claim 15 in which the plasma chamber is less than 15 mm in diameter and less than 30 mm in length.

17. The processing system of claim 15 in which the plasma chamber is less than 10 mm in diameter and less than 20 mm in length.

18. The processing system of claim 14 in which the power supply supplies an input power of less than 100 W.

19. The processing system of claim 18 in which the power supply supplies an input power of less than 50 W.

20. The processing system of claim 15 in which the plasma chamber comprises an inductively coupled plasma source.

21. The processing system of claim 20 in which the inductively coupled plasma source operated in a balanced antenna mode.

22. The processing system of claim 20 in which the plasma source uses a capacitively coupled plasma.

23. The processing system of claim 20 in which the plasma source is of the direct current type.

24. The processing system of claim 14 in which the gas decomposes to deposit a material on the work piece in the presence of the plasma.

25. The processing system of claim 14 in which the gas etches the work piece in the presence of the plasma.

26. The processing system of claim 14 further comprising a movable stage for positioning a work piece and an aperture between the plasma chamber and the moveable stage, the aperture being sufficiently small that an area impacted by a plasma beam from the plasma chamber having a diameter of less than 5 mm.

27. The plasma processing system of claim 14 further comprising a movable stage for positioning a work piece and an aperture between the plasma chamber and the moveable stage, the aperture being sufficiently small that an area impacted by a plasma beam from the plasma chamber is less than $\frac{1}{10}$ the area of the work piece.

28. The plasma processing system of claim 14 further comprising a beam limiting aperture positioned so that the reactive gas passes through the beam-limiting aperture before impacting the work piece.

* * * * *